June 19, 1956 M. E. MALCHOW 2,751,498
CRYSTAL CONTROLLED OSCILLATOR CIRCUIT
Filed April 30, 1954

INVENTOR.
Max E. Malchow
BY H. L. Newton
ATTORNEY

United States Patent Office 2,751,498

Patented June 19, 1956

2,751,498

CRYSTAL CONTROLLED OSCILLATOR CIRCUIT

Max E. Malchow, Collingswood, N. J., assignor to Radio Corporation of America, a corporation of Delaware Application April 30, 1954, Serial No. 426,732

6 Claims. (Cl. 250—36)

Figure 1:
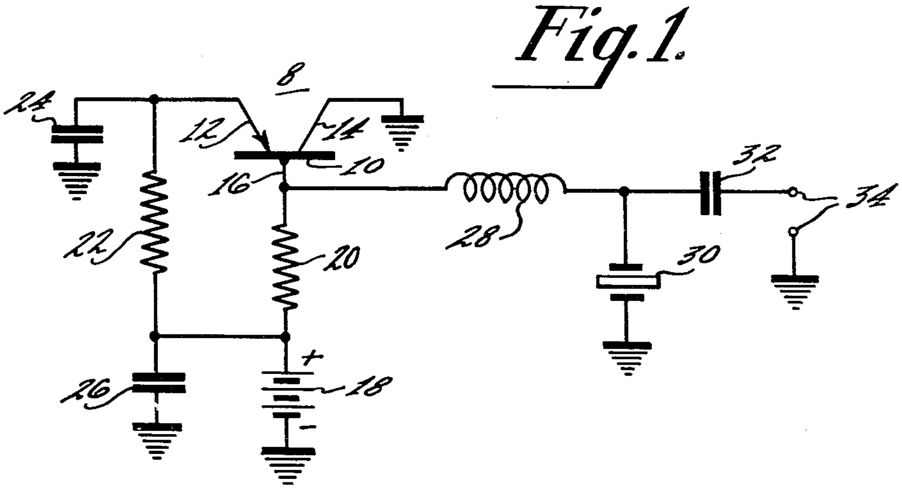

This invention relates to electrical signal generators or oscillator circuits and in particular to crystal controlled oscillator circuits utilizing semi-conductor devices such as transistors as active amplifying or control elements.

The recent development of commercially useful transistors has already had a decided effect upon, and has caused the introduction of many new techniques in the electrical signal communication field. Transistors, as is well known, are small in size, especially when compared with the ordinary vacuum tube, require no heater power, are very durable and consist of materials which appear to have a long useful life. Therefore, the use of transistors for oscillator as well as other circuit applications has been the subject of extensive investigation.

One of these investigations has involved circuits in which a piezoelectric crystal is used as the frequency controlling element of oscillator circuits utilizing transistors of the point-contact type. As an example of oscillator circuits of this type, reference may be made to Eberhard et al. Patent No. 2,570,436. Circuits of this type are characterized, in general, by their frequency stability and the excellence of the waveform which is obtainable.

In most of the known prior art crystal controlled oscillator circuits, an inductor is connected in shunt with the piezoelectric crystal to provide a direct current return path for one of the electrodes of the transistor. In many instances this results in operation wherein the inductor rather than the crystal provides the major portion of the frequency control function. This produces unreliable operation and is, of course, undesirable. Moreover, in the known oscillator circuits of the type referred to, the crystal tends to lose control of the oscillator frequency under certain operating conditions. This is particularly true at higher operating frequencies. Thus, for example, when the crystal ceases to oscillate, the effective capacity of the crystal is apt to resonate with the shunt inductor and oscillate out of control. While it would be desirable to eliminate these as well as other disadvantages of some of the prior art crystal controlled oscillator circuits, the desired improvements preferably should not be made at the expense of circuit efficiency or the magnitude of the available output signal.

It is, accordingly, an object of the present invention to provide improved crystal controlled oscillator circuits for utilizing transistors as active signal amplifying or control elements.

It is a further object of the present invention to provide a point-contact transistor oscillator circuit wherein the oscillator frequency may be controlled by piezoelectric crystal means to provide reliable and highly efficient operation.

It is another object of the present invention to provide an improved crystal controlled transistor oscillator circuit wherein effective control of the oscillator frequency may be maintained by simple crystal control means and relatively large output signals are obtainable.

These as well as other objects and advantages of the present invention are achieved in a transistor oscillator circuit by connecting a variable impedance element, such as an inductor, and a piezoelectric crystal in series between the base of a point-contact transistor and a source of fixed reference potential. By such an expedient, it has been found that the crystal maintains effective control of the oscillator frequency. Moreover, by connecting the crystal to the transistor in this manner, highly efficient operation and relatively large output signals are obtainable.

Figure 2:
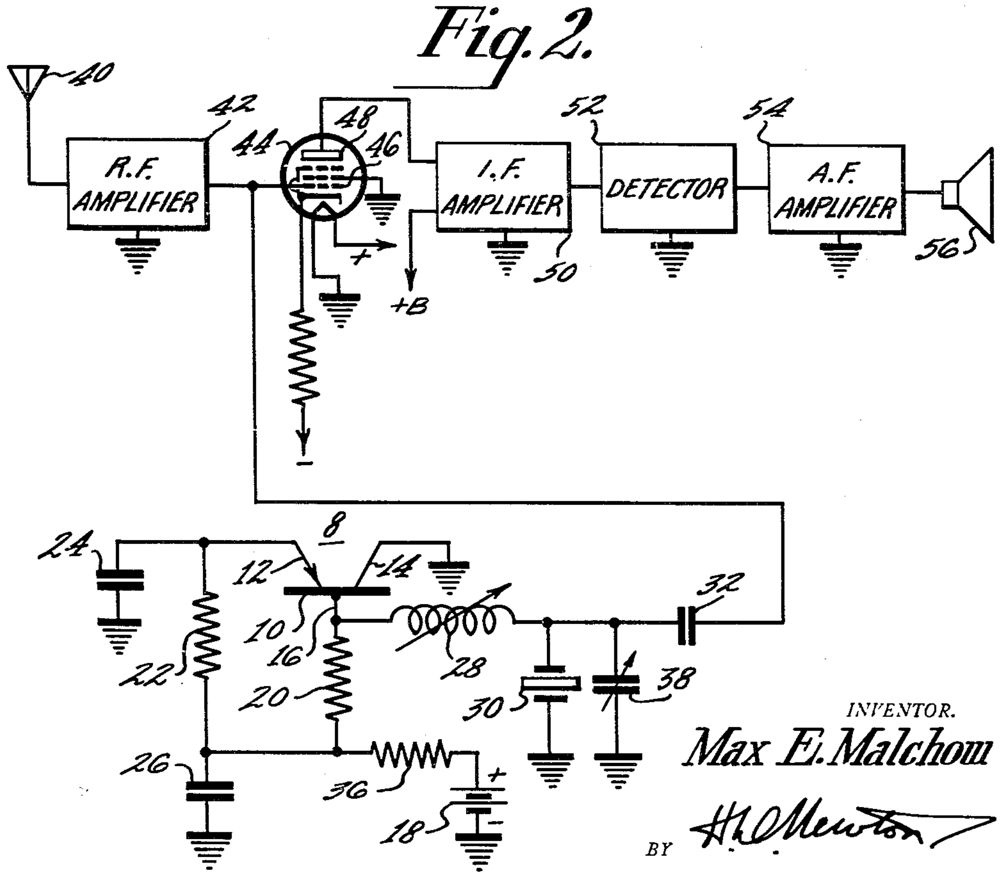

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a schematic circuit diagram of a crystal controlled oscillator circuit utilizing an N type point-contact transistor connected in accordance with the invention; and Figure 2 is a schematic circuit diagram, partially in block form, of a superheterodyne radio signal receiver utilizing a crystal controlled oscillator circuit embodying the present invention.

Referring now to the drawing, wherein like elements are designated by like reference numerals in both figures, and referring particularly to Figure 1, a point-contact transistor 8 of the N type includes a semi-conductive body 10 and three contacting electrodes which have been designated as an emitter 12, a collector 14 and a base 16. To provide proper biasing potentials for oscillator operation, the positive terminal of a battery 18 is connected through a resistor 20 to the base 16. The negative terminal of the battery 18 is returned to a source of fixed reference potential or ground for the system as shown. The positive terminal of the battery 18 is also connected through a resistor 22 to the emitter 12. The collector 14 of the transistor 8 is connected directly to ground. Signal by-pass to ground is provided by a by-pass capacitor 24 connected from the junction of the resistor 22 and the emitter 12 to ground and by a capacitor 26 which is connected from the junction of the positive terminal of the battery 18 and the biasing resistor 22 to ground.

As shown, the transistor 8 is biased for normal amplifier action, i. e., the emitter 12 is positive with respect to the base 16, while the collector 14 is negative with respect to the base 16. Thus, the collector 14 is referred to as being biased in the relatively non-conducting or reverse direction with respect to the base, while the emitter 12 is referred to as being biased in the relatively conducting or forward direction with respect to the base. While an N type point-contact transistor has been used to illustrate the invention, P type point-contact transistors may be used by reversing the polarity of the biasing source.

In accordance with the present invention, an inductor 28 which may be variable, and a piezoelectric crystal 30 are connected serially from the junction of the base 16 of the transistor 8 and the biasing resistor 20 to a source of fixed reference potential or ground for the system. Output signals may be obtained from the output terminals 34, one of which is grounded, while the other one is coupled through the coupling capacitor 32 to the junction point of the piezoelectric crystal 30 and the inductor 28.

In operation, a negative resistance is developed between the base and ground at the operating frequency of the point-contact transistor 8. Accordingly, if a piezoelectric crystal, which is often compared to a series resonant circuit, is connected in shunt with the base as shown in Figure 1, the circuit will oscillate due to the negative resistance which is supplied by the transistor 8. As a result, a sinusoidal output wave is developed and may be taken from the output terminals 34. The resonant frequency of the oscillator circuit is determined mainly by the resonant frequency of the crystal 30. Preferably, and for most applications, the circuit constants will be so chosen that the circuit oscillates at an overtone or harmonic frequency of the fundamental frequency of the crystal 30. Thus, the oscillator circuit embodying the invention will be most useful at relatively high frequencies. Vernier frequency adjustment may be provided by making the inductor 28 variable.

It has been found that by connecting the inductor 28 and the piezoelectric crystal 30 serially between the base and ground, in accordance with the invention, the loading of the base biasing resistor 20 on the piezoelectric crystal is reduced. Thus, the effective Q of the equivalent resonant circuit of the crystal is substantially the same as the actual Q and highly efficient and frequency stable operation is possible.

In addition, in most of the prior art circuits, an inductor is connected in shunt with the crystal as was explained hereinbefore. Two disadvantages result from such a connection. For one, the impedance which is connected across the piezoelectric crystal and which it sees has a theoretical maximum value equal to the negative resistance which is supplied by the transistor. Hence, the amplitude of available oscillatory energy is also limited. Moreover, in those instances where the crystal is not oscillating strongly or has ceased to oscillate, the circuit will oscillate at a frequency which is determined by the shunt inductor and the capacitance of the crystal holder plus any stray capacity which may be present in the circuit. In this manner, the crystal will lose control of the oscillations to the tuned circuit including the shunt inductor and circuit capacitance as described. This, of course, results in unreliable operation.

By virtue of the present invention these disadvantages of the prior art circuits are overcome and an oscillator circuit is provided wherein the crystal maintains effective control of the oscillations and the available oscillatory wave output is increased. It is assumed, of course, that the biasing potentials have been chosen so that a high impedance looking into the base has been provided. By connecting the inductor 28 in series with the crystal 30 between the base 16 and ground as shown, however, it has been found that the impedance which is reflected across the crystal 30 is increased by an amount which is proportional to the impedance of the inductor 28. Thus, the magnitude of the available oscillatory output signal will also be increased.

Moreover, it has been found that when the crystal ceases to oscillate the inductor 28 will be approximately series resonant with the circuit capacitance. Accordingly, a low impedance path to ground is provided under these operating conditions and the base 16 is shorted to ground unless the crystal 30 is oscillating. This will prevent oscillation of the circuit unless the crystal is oscillating and provides thereby highly reliable control of the oscillator circuit.

As described, it is evident that an oscillator circuit embodying the invention is characterized by several important advantages. Thus highly efficient as well as frequency stable operation is provided and the amplitude of the available output signal is increased. Additionally, the circuit has been found to have the distinct advantage that the crystal does not lose control of the frequency of oscillations.

While it will be understood that the circuit specifications may vary according to the design for any particular application, the following circuit specifications are included for the circuit of Figure 1, by way of example only. These circuit specifications are for an overtone crystal controlled oscillator circuit operating at a harmonic frequency of 38 megacycles.

| | |
|---|---|
| Capacitors **24**, **26** and **32** | 4, 780 and 1.5 micromicrofarads, respectively. |
| Resistors **20** and **22** | 1000 and 5600 ohms, respectively. |

A crystal controlled oscillator circuit which embodies the invention may find many applications, such as, for example, as the local oscillator of a high frequency communication receiver. Such an application is illustrated in Figure 2 of the drawing, reference to which is now made. The receiver includes, in general, an antenna 40, a radio frequency amplifying stage 42, a signal mixer 44, illustrated by way of example as being an electron discharge tube of the pentode type, an intermediate frequency amplifying stage 50, a signal detector 52, an audio frequency amplifying stage 54 and a loudspeaker or other sound reproducing means 56. In addition, an oscillator circuit of the type illustrated in Figure 1 supplies a local oscillator signal to the mixer 44 for heterodyning with the received signal. To this end, the output circuit of the oscillator is coupled through the coupling capacitor 32 to the control grid 46 of the tube 44. The plate or anode 48 of the pentode tube 44 is connected with the input circuit of the intermediate frequency amplifier stage 50.

The signal mixer could, of course, be a transistor. It is noted that a negative biasing voltage is applied to the cathode of the tube 44. By this expedient, if the remaining stages of the receiver utilize transistors, one biasing supply may be utilized to provide collector biasing voltage as well as biasing voltage for the tube 44.

The receiver as shown is connected to be operative in accordance with well known superheterodyne principles. Thus, the oscillator signal is applied to the grid 46 of the mixer tube 44 where it is heterodyned with the received signal to produce a beat or intermediate frequency signal, whose frequency may be either the sum or the difference of the received signal and the oscillator signal. The intermediate frequency signal is then amplified by the intermediate frequency amplifying stage 50. The amplified intermediate frequency signals are then applied to the detector 52 where the received signal is separated from the modulation component. The resultant audio frequency signal is then amplified by the audio frequency amplifying stage 54 and applied to the loudspeaker 56 for reproduction.

As illustrated, the oscillator circuit shown in Figure 2 is seen to be substantially identical to the one illustrated in Figure 1. A decoupling resistor 36 is connected, however, in series between the base biasing resistor 20 and the positive terminal of the biasing battery 18. In addition, adjustment of the resonant frequency of the oscillator circuit is provided by connecting the variable trimmer capacitor 38 in shunt with the piezoelectric crystal 30. In other respects, this circuit will be seen to be identical with the circuit which has been illustrated in Figure 1 of the drawing.

As described herein, it is evident that efficient and highly stable operation is provided by a crystal controlled point-contact transistor oscillator circuit constructed in accordance with the invention. In addition, the amplitude of the available oscillator signal is maximized and the crystal maintains control of the frequency of oscillations. These desirable results are achieved, moreover, by a circuit which utilizes a minimum number of circuit elements and is, therefore, economical.

What is claimed is:

1. A crystal controlled oscillator circuit comprising a semi-conductor device having a semi-conductive body and base, emitter and collector electrodes cooperatively associated therewith, means for applying operating bias voltages to said electrodes, and frequency determining means for said oscillator circuit including an impedance element and a piezoelectric crystal serially connected between said base electrode and a source of reference potential.

2. A crystal controlled high frequency oscillator circuit comprising a semi-conductor device having a semiconductive body and base, emitter and collector electrodes cooperatively associated therewith, means for applying operating bias voltages to said electrodes wherein said device exhibits a negative resistance characteristic over the operating range of said oscillator circuit, and frequency determining means for said oscillator circuit including an inductor and a piezoelectric crystal serially connected between said base electrode and a point of ground potential.

3. A crystal controlled high frequency oscillator circuit comprising a transistor having a semi-conductive body of the point-contact type and base, emitter and collector electrodes cooperatively associated therewith, means for applying operating bias voltages to said electrodes wherein said transistor exhibits a negative resistance characteristic over the operating range of said oscillator circuit, frequency determining means for said oscillator circuit including a variable inductor and a piezoelectric crystal serially connected between said base electrode and a point of ground potential, and an output circuit coupled to the junction of said inductor and said crystal for deriving an output signal of a frequency determined by the resonant frequency of said crystal.

4. A crystal controlled high frequency oscillator circuit comprising a transistor having a semi-conductive body of the point-contact type and base, emitter and collector electrodes cooperatively associated therewith, means for applying operating bias voltages to said electrodes wherein said collector electrode is biased in a relatively non-conducting direction relative to said base electrode and said emitter electrode is biased in a relatively conducting direction relative to said base electrode, an inductor connected with said base electrode, and a piezoelectric crystal having a selected resonant frequency connected in series between said inductor and a point of fixed potential to provide frequency control of said oscillator circuit.

5. In a radio signal receiver, the combination comprising a crystal controlled high frequency oscillator circuit including a point-contact transistor having base, emitter and collector electrodes; means for applying operating bias voltages to said electrodes; said means including a source of direct current voltage having one terminal connected to a point of fixed potential, a first resistor connected in series between said emitter electrode and the other terminal of said source, and a second resistor connected in series between said base electrode and the other terminal of said source; conductive circuit means connecting said collector electrode to said point of fixed potential; frequency determining control means for said oscillator circuit including an inductor and a piezoelectric crystal connected in series from the junction of said second resistor and said base electrode to said point of fixed potential; and an output circuit coupled to the junction of said inductor and said crystal for deriving an output signal of a frequency determined by the resonant frequency of said crystal.

6. In an oscillator circuit the combination with a point-contact transistor having a base electrode, an emitter electrode and a grounded collector electrode, of biasing means connected with said base and emitter electrodes for applying a forward bias voltage therebetween, said biasing means being adjusted wherein said transistor exhibits a negative resistance characteristic, frequency control means connected between said base electrode and a point of fixed potential including a serially connected impedance element and a piezoelectric crystal, and an output circuit coupled with said base electrode for deriving an oscillatory output signal therefrom.

References Cited in the file of this patent

UNITED STATES PATENTS

| | | |
|---|---|---|
| 2,570,436 | Eberhard et al. | Oct. 9, 1951 |
| 2,600,124 | Mortley | June 10, 1952 |
| 2,620,448 | Wallace | Dec. 2, 1952 |